US008332787B2

(12) United States Patent
Kessler et al.

(10) Patent No.: US 8,332,787 B2
(45) Date of Patent: Dec. 11, 2012

(54) REUSABLE STRUCTURED HARDWARE DESCRIPTION LANGUAGE DESIGN COMPONENT

(75) Inventors: Friedhelm Kessler, Boeblingen (DE); Thomas M. Makowski, Pfullingen (DE); Harald Mielich, Stuttgart (DE); Ulrich Weiss, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 12/940,762

(22) Filed: Nov. 5, 2010

(65) Prior Publication Data

US 2012/0117524 A1 May 10, 2012

(51) Int. Cl.
*G06F 17/50* (2006.01)
(52) U.S. Cl. ...................................................... 716/104
(58) Field of Classification Search .................. 716/100, 716/104
See application file for complete search history.

(56) References Cited

U.S. PATENT DOCUMENTS

| | | | | |
|---|---|---|---|---|
| 5,426,591 | A | * | 6/1995 | Ginetti et al. ................. 716/104 |
| 5,937,190 | A | * | 8/1999 | Gregory et al. ............... 717/131 |
| 6,080,201 | A | | 6/2000 | Hojat et al. |
| 6,132,109 | A | * | 10/2000 | Gregory et al. ............... 717/131 |
| 6,470,482 | B1 | | 10/2002 | Rostoker et al. |
| 2004/0139408 | A1 | | 7/2004 | Boluki et al. |
| 2005/0193280 | A1 | * | 9/2005 | Schubert et al. ................ 714/47 |
| 2006/0195822 | A1 | * | 8/2006 | Beardslee et al. ............. 717/124 |
| 2007/0234257 | A1 | | 10/2007 | Pandey et al. |
| 2008/0127009 | A1 | * | 5/2008 | Veneris et al. ...................... 716/4 |
| 2010/0058271 | A1 | | 3/2010 | Correale, Jr. et al. |

OTHER PUBLICATIONS

Ellervee, Peeter et al., "Improved VHDL Input for High-Level Synthesis Tool xTractor", *The 10th Biennial Baltic Electronic Conference* (BEC'2006), Tallinn, Estonia Oct. 2006, 4 pages.

Manohararajah, Valavan et al., "Difficulty of Predicting Interconnect Delay in a Timing Driven FPGA CAD Flow", *In Proceedings of the 2006 international Workshop on System-Level interconnect Prediction* (Munich, Germany, Mar. 4-5, 2006, 6 pages.
Park, Edwin C., "How to run an FPGA at ASIC speed", http://www.electronicsweekly.com/Articles/2007/08/20/42039/how-to-run-an-fpga-at-asic-speed.htm (Obtained from the Internet on Apr. 30, 2010) Aug. 20, 2007, 6 pages.
SéMéria, Luc, "Applying Pointer Analysis to the Synthesis of Hardware from C", Jun. 2001, 146 pages.
Wender, Reid, "Soft IP Actually Does Exist for the Analog ASIC", http://chipdesignmag.com/display.php?articleId=1369 (Obtained from the Internet on Apr. 30, 2010) Jun./Jul. 2007, 8 pages.

* cited by examiner

*Primary Examiner* — Suchin Parihar
(74) *Attorney, Agent, or Firm* — DeLizio Gilliam, PLLC (57) ABSTRACT

A method includes removing a code segment from a hardware description language design to create a modified hardware description language design. The code segment represents at least one time sensitive path in the hardware description language design. The method includes creating a delta list of differences between the modified hardware description language design and a physical hardware representation that is logically equivalent to the hardware description language design. The method includes extracting a portion of the physical hardware representation that corresponds to the time sensitive path based, at least in part, on the delta list. The method also includes creating a structured hardware description language design of the time sensitive path using the extracted portion of the physical hardware representation, wherein the structured hardware description language design comprises structural information of the extracted portion of the physical hardware representation.

15 Claims, 5 Drawing Sheets

REUSABLE STRUCTURED HARDWARE DESCRIPTION LANGUAGE DESIGN COMPONENT

BACKGROUND

Different hardware description languages (such as Very High Speed Integrated Circuit Hardware Description Language (VHDL)) are used in electronic design automation to described different types of circuit designs (including digital, mixed-signal, etc.). These hardware description languages are used to describe a logic circuit according to structure, data flow behavior, function, etc.

Some hardware designs include timing critical structures (e.g., adders, multiplexer, etc.). Tools for synthesis, placement, and wiring generally do not provide a sufficient physical implementation or representation for these timing critical structures. In particular, these timing critical structures need special placement and wiring or have a very ordered structure that needs special guidance for synthesis.

SUMMARY

Embodiments include a method comprising removing a code segment from a hardware description language design to create a modified hardware description language design. The code segment represents at least one time sensitive path in the hardware description language design. The method includes creating a delta list of differences between the modified hardware description language design and a physical hardware representation that is logically equivalent to the hardware description language design. The method includes extracting a portion of the physical hardware representation that corresponds to the time sensitive path based, at least in part, on the delta list. The method also includes creating a structured hardware description language design of the time sensitive path using the extracted portion of the physical hardware representation, wherein the structured hardware description language design comprises structural information of the extracted portion of the physical hardware representation.

Embodiments include a method comprising removing a part of a logic from a hardware description language design to create a modified hardware language design. The part of the logic comprises at least one time sensitive path in the hardware description language design. The method includes comparing the modified hardware language design to a physical representation that is logically equivalent to the hardware description language design to create a delta list of differences. The method also includes creating a modified physical representation that includes a part of the physical representation that includes the logical equivalent of the part of the logic comprising the time sensitive path, using the delta list of differences. The method includes creating a structured hardware description language design of the part of the logic comprising the time sensitive path using the modified physical representation. The structured hardware description language design comprises a physical implementation requirement of at least one component. The method includes modifying the structured hardware description language design. The modifying updates the structured hardware description language design to comply with requirements of a synthesis operation of a synthesis tool. The modifying also precludes the synthesis tool from modifying the physical implementation requirement of the component.

Embodiments include a computer program product for creating a structured hardware description language design. The computer program product comprises a computer readable storage medium having computer readable program code embodied therewith. The computer readable program code is configured to remove a code segment from a hardware description language design to create a modified hardware description language design. The code segment represents at least one time sensitive path in the hardware description language design. The computer readable program code is configured to create a delta list of differences between the modified hardware description language design and a physical hardware representation that is logically equivalent to the hardware description language design. The computer readable program code is configured to extract a portion of the physical hardware representation that corresponds to the time sensitive path based, at least in part, on the delta list. The computer readable program code is also configured to create the structured hardware description language design having the time sensitive path using the extracted portion of the physical hardware representation, wherein the structured hardware description language design comprises structural information of the extracted portion of the physical hardware representation.

Embodiments include an apparatus comprising a processor. The apparatus also comprises a structured hardware description language design module executable on the processor. The structured hardware description language design module is configured to remove a code segment from a hardware description language design to create a modified hardware description language design. The code segment represents at least one time sensitive path in the hardware description language design. The structured hardware description language design module is configured to create a delta list of differences between the modified hardware description language design and a physical hardware representation that is logically equivalent to the hardware description language design. The structured hardware description language design module is configured to extract a portion of the physical hardware representation that corresponds to the time sensitive path based, at least in part, on the delta list. The structured hardware description language design module is also configured to create the structured hardware description language design having the time sensitive path using the extracted portion of the physical hardware representation, wherein the structured hardware description language design comprises structural information of the extracted portion of the physical hardware representation.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences, and computer program products that embody techniques of the present inventive subject matter. However, it is understood that the described embodiments may be practiced without these specific details. In other instances, well-known instruction instances, protocols, structures, and techniques have not been shown in detail in order not to obfuscate the description. While examples are described in reference to VHDL, some example embodiments can be used in any other type of hardware design language (e.g., Verilog). Also while examples are described for optimization of parts of a hardware design having timing critical paths that include timing critical structures, some example embodiments can optimize any other part of a hardware design for a digital signal system, mixed signal system, etc.

Some example embodiments create a reusable VHDL component that is modified to incorporate different physical implementations—a structured VHDL component. In contrast to conventional VHDL, the structured VHDL component can include physical sizes and placement of the different components of the hardware design for an integrated circuit. The structured VHDL component can also include wiring information (such as layer, width, etc.) for wires connecting components of the hardware design. These structured VHDL components can be derived from a previous VHDL design. In some example embodiments, at least some part of this previous VHDL design has been manually optimized to provide better timing using a best selection of physical sizes and placement of the different components along with a best selection of wiring information. Conventional synthesis tools provide a physical representation of the design. In particular, synthesis tools translate the VHDL into physical components (e.g., OR gates, NAND gates, NOR gates, etc.). These physical components are layouts in a library. Also for synthesis, these gates are black boxes that described their function. The layouts include already placed transistors and wiring. The gates and their connections define the netlist for a physical representation of the design. However, this physical representation may not be the best selection for optimal timing in the design. For example, conventional synthesis tools may place different components of the design in a particular configuration. This particular configuration can satisfy all of the requirements for the design. However, a different configuration (manually determined by an experienced hardware designer) may produce a better design (e.g., more optimal timing). In particular, hardware designers can review the entire layout of a given hardware design to determine the location of logic relative to each other to optimize timing among such logic. Conventional synthesis tools perform an iterative approach to determine a best design for parts of the overall design. However, these conventional synthesis tools typically cannot make decisions for best design based on the entire layout that can comprise any number of components.

As another example, conventional synthesis tools may select a particular type of wire (e.g., layer, width, etc.) that meets timing requirements for the design. However, a different selection of the wiring (manually determined by an experienced hardware designer) may produce a better design (e.g., more optimal timing). An optimal selection of the physical representation is especially important for timing critical structures in the design. A timing critical structure can include any component in the design that can be impacted by timing (e.g., adders, multiplexers, etc.).

Therefore, hardware designers can extract the timing critical paths from a given VHDL design. Theses hardware designers can then manually optimize the physical representations of these timing critical paths (e.g., size and placement of components, wiring information, etc.). These optimizations of the physical representations of these timing critical paths are captured. In some example embodiments, these optimizations are incorporated in the VHDL for these timing critical paths to create a structured VHDL design. The structured VHDL design can then be stored and subsequently reused in other designs by other hardware designers. Accordingly, these other hardware designers have an optimized physical representation of these timing critical paths (which are not producible by conventional synthesis tools).

As described, conventional designs are required to be hierarchical, while some example embodiments can include a flat design. In particular in conventional designs, blocks include individual parts of the design. Such blocks typically have been custom designed by hardware designers. Conventional synthesis tools cannot access the internal designs within these blocks. Therefore, these conventional designs are hierarchical because there are two separate parts for a physical implementation—a first part created by synthesis and a second part created manually by hardware designers. In contrast, some example embodiments provide a flat design wherein the manually created designs are accessible by the synthesis tool, such that the synthesized design is combined with the manually created designs.

Figure 1:
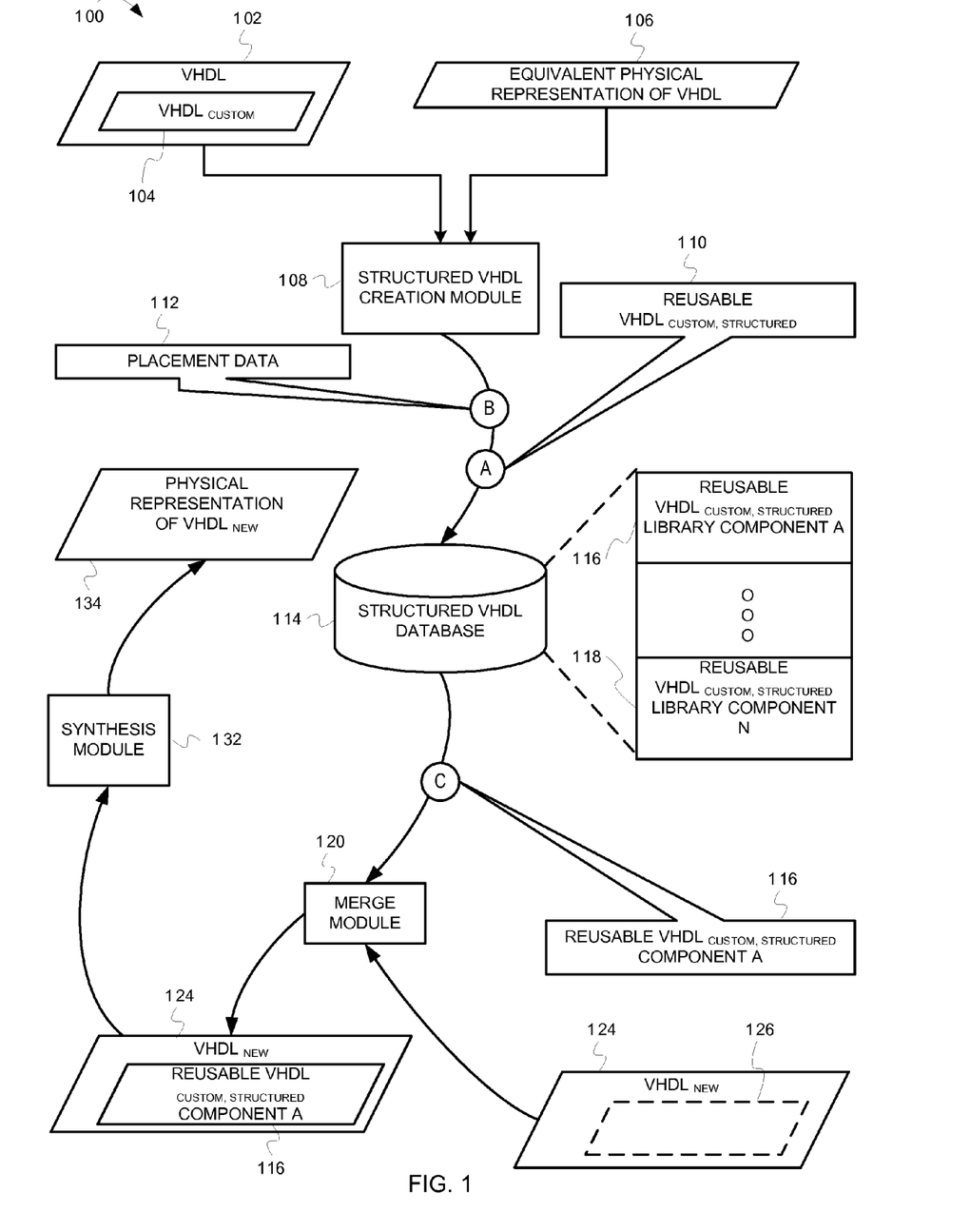
FIG. 1 is a block diagram illustrating a system for creating and using reusable structured VHDL, according to some example embodiments.

FIG. 1 is a block diagram illustrating a system for creating and using reusable structured VHDL, according to some example embodiments. FIG. 1 includes a system 100 that includes a structured VHDL creation module 108, a merge module 120, a synthesis module 132, and a structured VHDL database 114. The structured VHDL creation module 108, the merge module 120, and the synthesis module 132 can be software, hardware, firmware or a combination thereof for performing operations described herein. The structured VHDL database 114 can be any type of machine-readable storage media for storage of data therein.

The system also includes a VHDL circuit design 102 and an equivalent physical representation 106 of the VHDL circuit design 102. The equivalent physical representation 106 includes an actual hardware implementation that is logically equivalent to the VHDL circuit design 102. The equivalent physical representation 106 can include the gates, the wiring, and the physical layout including positioning of the different components relative to each other, number of layers, location of components and wiring within the layers, etc.

The VHDL circuit design 102 includes a $VHDL_{custom}$ circuit design 104. In some example embodiments, the $VHDL_{custom}$ circuit design 104 is a part of the logic that includes some or all of the timing critical paths within the VHDL circuit design 102. The VHDL circuit design 102 also includes an input/output map for all input/output to and from the components in the $VHDL_{custom}$ circuit design 104. In some example embodiments, the equivalent physical representation 106 is derived from a combination of the output of the synthesis module 132 from processing the VHDL circuit design 102 and manual modification of this output. In particular, a hardware designer can manually optimize at least a part of the equivalent representation 106 that includes the logical equivalent of the $VHDL_{custom}$ circuit design 104. This can include a part of the circuit design having the timing critical paths. The hardware designer can optimize the location or placement of the components in the timing critical paths, the size and types of components, and the wiring information (such as which of the layers the wire is within, the width of the wire, the spacing of the wire relative other wires and components, etc.).

The structured VHDL creation module 108 receives the VHDL circuit design 102 and the equivalent physical representation 106 as inputs. The structured VHDL creation module 108 processes the VHDL circuit design 102 and the equivalent physical representation 106 to output a reusable $VHDL_{custom,\ structured}$ circuit design 110 and placement data 112. As further described below, the reusable $VHDL_{custom,\ structured}$ circuit design 110 comprises the $VHDL_{custom}$ circuit design 104 wherein data from a part of the equivalent physical representation 106 has been incorporated therein. Such data are physical implementations of the components of the $VHDL_{custom}$ circuit design 104. This data can include the size and types of components, and the wiring information (such as which of the layers the wire is within, the width of the wire, the spacing of the wire relative to other wires and components, etc.). The associated placement data 112 includes the location or placement of the components in the $VHDL_{custom}$ circuit design 104. In this example, the structured VHDL creation module 108 inputs the reusable $VHDL_{custom,\ structured}$ circuit design 110 and the associated placement data 112 into the structured VHDL database 114. Accordingly, the structured VHDL database 114 can store a library of reusable components. Each reusable component can include the structured VHDL and placement data for a given circuit design. These library components are shown as a reusable $VHDL_{custom,\ structured}$ library component A 116, a reusable $VHDL_{custom,\ structured}$ library component N 118, etc. Accordingly, each of these library components can comprise some physical implementations of a given circuit design that has been optimized for timing critical paths. As noted above, this optimization can be manually performed by hardware designers. This is in contrast to a physical implementation output by a synthesis tool/module that generally has not been optimized, especially for timing critical paths.

Any of these library components can be reused in other circuit designs. In this example, a merge module 120 can receive a new VHDL circuit design—a $VHDL_{new}$ circuit design 124 that includes a part 126 wherein a reusable library component from the structured VHDL database 114 can be placed. In this example, the merge module 120 retrieves the reusable $VHDL_{custom,\ structured}$ library component A 116 for incorporation into the $VHDL_{new}$ circuit design 124—shown as 122. In particular, the merge module 120 merges the $VHDL_{new}$ circuit design 124 with the reusable $VHDL_{custom,\ structured}$ library component A 116, such that the reusable $VHDL_{custom,\ structured}$ library component A 116 replaces the part 126. As a result, the merge module 120 outputs the $VHDL_{new}$ circuit design 124 that has been merged with the reusable $VHDL_{custom,\ structured}$ library component A 116. This merging can be in response to a command by a hardware designer. In particular, the hardware designer can create the $VHDL_{new}$ circuit design 124. The hardware designer can also review the library components in the structured VHDL database 114 to locate the reusable $VHDL_{custom,\ structured}$ library component A 116 for their current design.

As shown, the $VHDL_{new}$ circuit design 124 with the reusable $VHDL_{custom}$, structured library component A 116 can be input into the synthesis module 132 to create the logically equivalent physical representation of the $VHDL_{new}$ circuit design 124 with the reusable $VHDL_{custom,\ structured}$ library component A 116—physical representation 134. As described above, in some example embodiments, the structured VHDL creation module 108 created the reusable $VHDL_{custom,\ structured}$ library component A 116 such that the synthesis module 132 cannot modify the physical implementations defined within the reusable $VHDL_{custom,\ structured}$ library component A 116. Accordingly, the physical representation 134 includes optimized physical implementations for the circuit design that includes the reusable $VHDL_{custom,\ structured}$ library component A 116. In other words, hardware designers can leverage the optimizations performed by previous hardware designers using prior VHDL circuit designs modified to have definitions of physical implementations of components therein.

Figure 2:
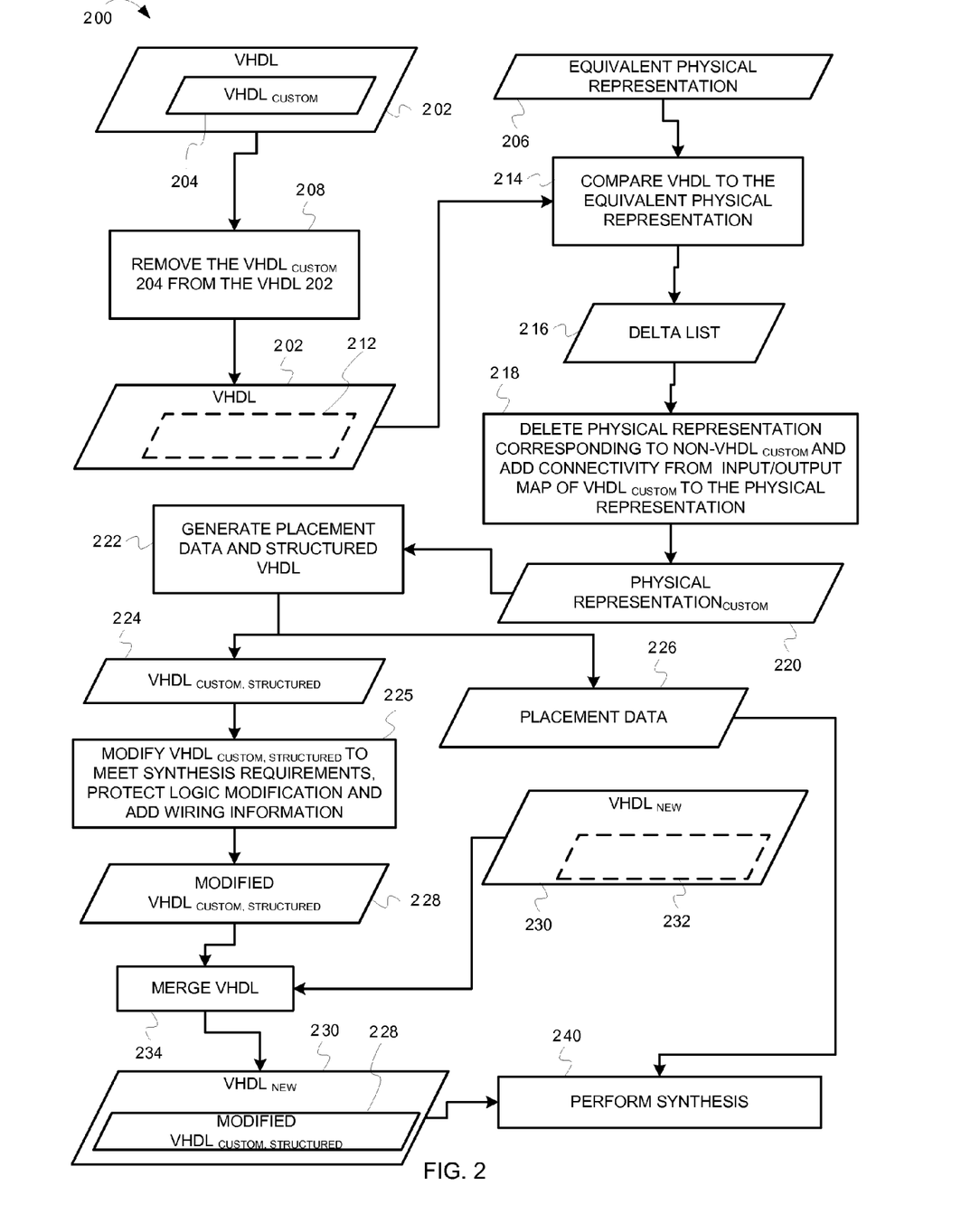
FIG. 2 is a data flow diagram for creating and using reusable structured VHDL, according to some example embodiments.

A more detailed description of the operations for creating and using reusable structured VHDL is now described. In particular, FIG. 2 is a data flow diagram for creating and using reusable structured VHDL, according to some example embodiments.

A data flow diagram 200 includes two data inputs—a VHDL circuit design 202 and an equivalent physical representation 206 of the VHDL circuit design 202. As described above, the equivalent physical representation 206 includes the actual hardware implementation that is logically equivalent to the VHDL circuit design 202. The equivalent physical representation 206 can include the gates, the wiring, and the physical layout including positioning of the different components relative to each other, number of layers, location of components and wiring within the layers, etc.

The VHDL circuit design 202 includes a $VHDL_{custom}$ circuit design 204. As described above, in some example embodiments, the $VHDL_{custom}$ circuit design 204 is a part of the logic that includes some or all of the timing critical paths within the VHDL circuit design 202. In some other example embodiments, the $VHDL_{custom}$ circuit design 204 can be any part of the design, whose physical representation has been manually optimized by a hardware designer. For example, the optimization can be for timing, spacing, etc. An example of VHDL code in the VHDL circuit design 202 including the $VHDL_{custom}$ circuit design 204 is shown below:

```
ENTITY l2_cadf_or IS PORT (
    vdd              : inout power_logic;
    gnd              : inout power_logic;
    hl_waya_in       : in std_ulogic_vector( 0 to 23);
    hl_wayb_in       : in std_ulogic_vector( 0 to 23);
    hl_wayc_in       : in std_ulogic_vector( 0 to 23);
    to_l1_ow_in      : in std_ulogic_vector( 0 to 23);
    h05_h06_sel_to_l1_ins_q : in std_ulogic;
);
END l2_cadf_or;
ARCHITECTURE l2_cadf_or OF l2_cadf_or IS
BEGIN
    ow_read_out      <= hl_waya_in OR hl_wayb_in OR
        hl_wayc_in OR (gate_AND(h05_h06_sel_to_l1_ins_q,
        to_l1_ow_in));
END l2_cadf_or;
```

In this example, the VHDL code for the $VHDL_{custom}$ circuit design 204 comprises the bolded section.

The $VHDL_{custom}$ circuit design 204 is removed from the VHDL circuit design 202 (208). With reference to FIG. 1, the structured VHDL creation module 108 can perform this removal. The result is the VHDL circuit design 202 with a part 212 where the $VHDL_{custom}$ circuit design 204 has been removed. The VHDL circuit design 202 without the $VHDL_{custom}$ circuit design 204 and the equivalent physical representation 206 is input into an operation 214. The VHDL circuit design 202 without the $VHDL_{custom}$ circuit design 204 is compared to the equivalent physical representation 206 (214). With reference to FIG. 1, the structured VHDL creation module 108 can perform this comparison. The result is a delta list 216 that includes the differences between the VHDL circuit design 202 without the $VHDL_{custom}$ circuit design 204 and the equivalent physical representation 206. The delta list 216 can comprise all of the physical differences between the VHDL circuit design 202 without the $VHDL_{custom}$ circuit design 204 and the equivalent physical representation 206.

The delta list 216 can include circuits that are coupled together with nets and pins that are providing the input/output.

The delta list 216 of differences is then processed to delete any parts of the equivalent physical representation 206 that corresponds to non-VHDL$_{custom}$ circuit design 204 (218). Additionally, connectivity of the input/output map of the VHDL$_{custom}$ circuit design 204 is added to the remaining equivalent physical representation (218). Accordingly, the remaining part of the equivalent physical representation 206 corresponds to the VHDL$_{custom}$ circuit design 204—see the output physical representation$_{custom}$ 220. With reference to FIG. 1, the structured VHDL creation module 108 can perform these updates to the equivalent physical representation 206. The physical representation$_{custom}$ 220 is then processed (222) to generate placement data 226 and a modified VHDL for the VHDL$_{custom}$ circuit design 204 (VHDL$_{custom, structured}$ circuit design 224). The VHDL$_{custom}$ circuit design 204 and the VHDL$_{custom, structured}$ circuit design 224 are logically equivalent.

An example of VHDL code in the VHDL$_{custom, structured}$ circuit design 224 is shown below:

```
ENTITY l2_cadf_or IS PORT (
    vdd                        : inout power_logic;
    gnd                        : inout power_logic;
    hl_waya_in                 : in std_ulogic_vector( 0 to 23);
    hl_wayb_in                 : in std_ulogic_vector( 0 to 23);
    hl_wayc_in                 : in std_ulogic_vector( 0 to 23);
    to_l1_ow_in                : in std_ulogic_vector( 0 to 23);
    h05_h06_sel_to_l1_ins_q : in std_ulogic;
    ow_read_out                : out std_ulogic_vector( 0 to 23)
);
END l2_cadf_or;
ARCHITECTURE l2_cadf_or OF l2_cadf_or IS
ATTRIBUTE NET_DATA OF n_or_22_Xnet22 : SIGNAL IS
"WC=/W20S10L15/";
BEGIN
........
    x_or_22_Xi8: entity stdcell.cw_nand3_e5n_rn_16c
        PORT MAP ( a => n_or_22_Xnet19,
            b => n_or_22_Xnet20,
            c => n_or_22_Xnet22,
            y => n_or_22_or_out;
........
END l2_cadf_or;
```

In this example, the bolded section of the VHDL code comprises the added structure that defines physical representations that have been optimized by a hardware designer—see description above of the physical representation 206 that is logically equivalent to the VHDL$_{custom}$ circuit design 204. As described above, these physical descriptions that can be incorporated into VHDL code (to create a structured VHDL code) can include physical sizes and types of hardware components used to implement the VHDL logic, how the hardware components (e.g., gates) are coupled together, wiring information (such as layer, width, etc.) for wires connecting components of the hardware design, etc.

The placement data 226 includes data that defines the location in the overall layout of the different hardware components in the design. An example of the placement data 226 is shown below:
    PLACE   xor_1_x_or_22_xi8   2952   54   N   0 MOVETYPE=FIXED Another example of placement data 226 that is used for certain types of hardware components (e.g., latches) is shown below:

xlcbcntl_blk_encode_0   xlcbcntl_blk_cicbs   xlcbcntl_blk_cicbs_0 xlcbcntl_blk_encode_0

This example includes data that defines the location in the overall layout of certain types of hardware components in the design. Accordingly, different placement data 226 may be used to provide a sufficient definition of overall layout of all the components in the design.

With reference to FIG. 1, the structured VHDL creation module 108 can generate the placement data and the structured VHDL. The VHDL$_{custom, structured}$ circuit design 224 is modified (225). In particular, the VHDL$_{custom, structured}$ circuit design 224 is modified to meet synthesis requirements. For example, keywords that enable the synthesis tool/module to process this structured VHDL. These keywords can identify the code that has been added to the VHDL that provide definitions of the physical representations of parts of the design. These keywords enable the synthesis tool/module to be able to process this new code that provides definitions of the physical representations of parts of the design. The VHDL$_{custom, structured}$ circuit design 224 can also be modified to add keywords to preclude the synthesis tool/module from modifying these definitions of the physical representations that have been added to the VHDL code. In particular, these physical representations include an optimization that has been manually performed by a hardware designer. These optimizations need to be protected so that the synthesis tool/module does not change or overwrite these optimizations. The VHDL$_{custom, structured}$ circuit design 224 can also be modified to add the wiring information (such as which of the layers the wire is within, the width of the wire, the spacing of the wire relative to other wires and components, etc.). An example of VHDL code in a modified VHDL$_{custom, structured}$ circuit design 228 is shown below:

```
x_or_22_Xi8 : entity stdcell.cw_nand3_e5n_rn
    generic map (bhc => "16c")
    PORT MAP ( a => tconv(n_or_22_Xnet19),
        b => tconv(n_or_22_Xnet20),
        c => tconv(n_or_22_Xnet22),
        tconv(y) => n_or_22_or_out);
```

In this example, the bolded section has been added to indicate to the synthesis module/tool that it is not to change the physical representations that have been added to the VHDL code. With reference to FIG. 1, the structured VHDL creation module 108 can perform this modification to the VHDL$_{custom, structured}$ circuit design 224 to create the modified VHDL$_{custom, structured}$ circuit design 228.

The remaining dataflow operations can be performed at a later time that can be initiated in response to a different command. For example, a different hardware designer can initiate the remaining operations to reuse the modified VHDL$_{custom, structured}$ circuit design 228 in a new VHDL design. In particular, the modified VHDL$_{custom, structured}$ circuit design 228 can be stored in a database for subsequent reuse (see the structured VHDL database 114 of FIG. 1). As shown in FIG. 2, a new VHDL circuit design 230 has been created. The new VHDL circuit design 230 includes a part 232 where the modified VHDL$_{custom, structured}$ circuit design 228 can be inserted. Accordingly, the new VHDL circuit design 230 is merged with the modified VHDL$_{custom, structured}$ circuit design 228 (234). With reference to FIG. 1, the merge module 120 can perform this merge.

Synthesis can be performed (240) to create a physical representation of the new VHDL circuit design 230 (which includes the modified VHDL$_{custom, structured}$ circuit design 228). With reference to FIG. 1, the synthesis module 132 can perform this synthesis. As described above, the modified VHDL$_{custom,\ structured}$ circuit design 228 has been written to preclude the synthesis module 132 from changing the physical representations therein (which have already been optimized). In some example embodiments, the timing information for the gates in the structured VHDL is still provided by the library for the synthesis tool. No optimization of those gates is done by the synthesis tool but timing is seen. Such a configuration is in contrast to conventional synthesis tools that require a delivery of a timing rule to synthesis.

Figure 3:
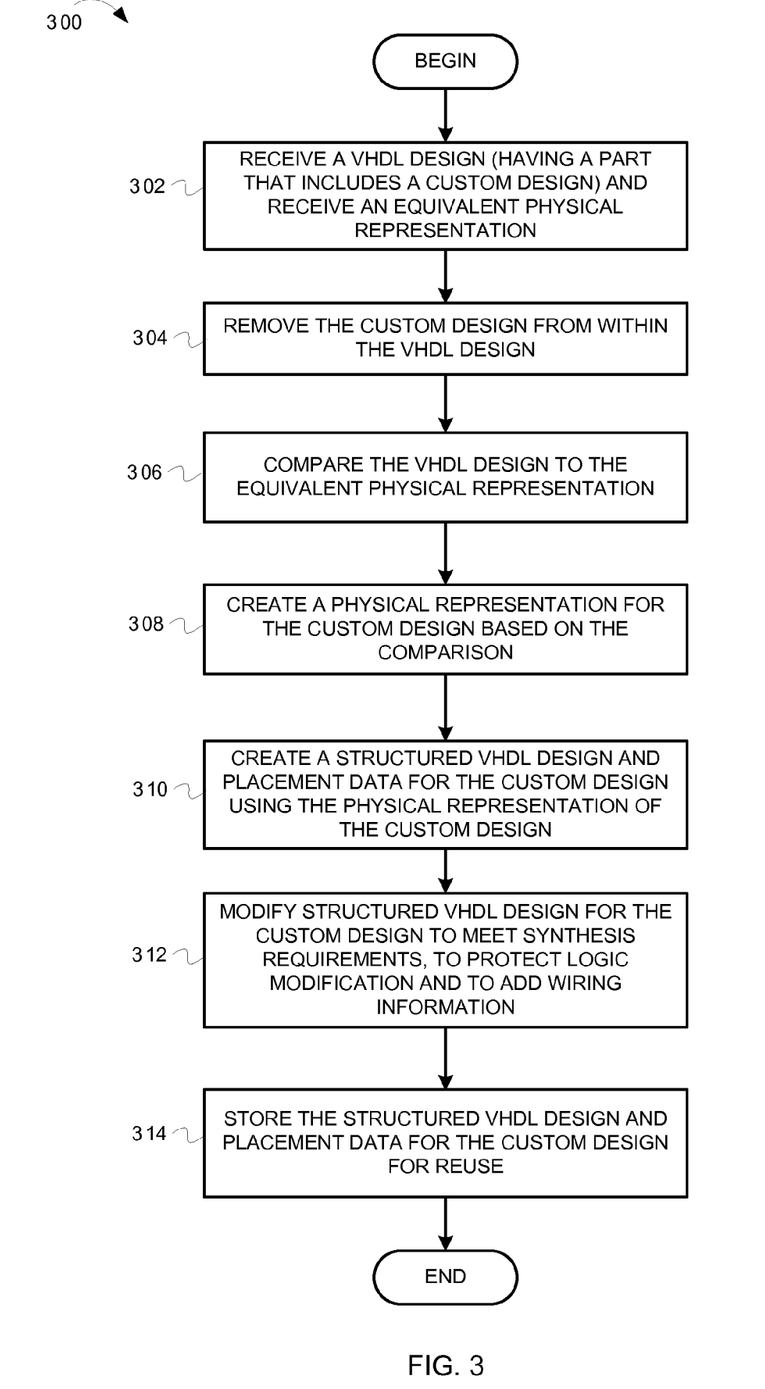
FIG. 3 is a flowchart for creating reusable structured VHDL, according to some example embodiments.
Figure 4:
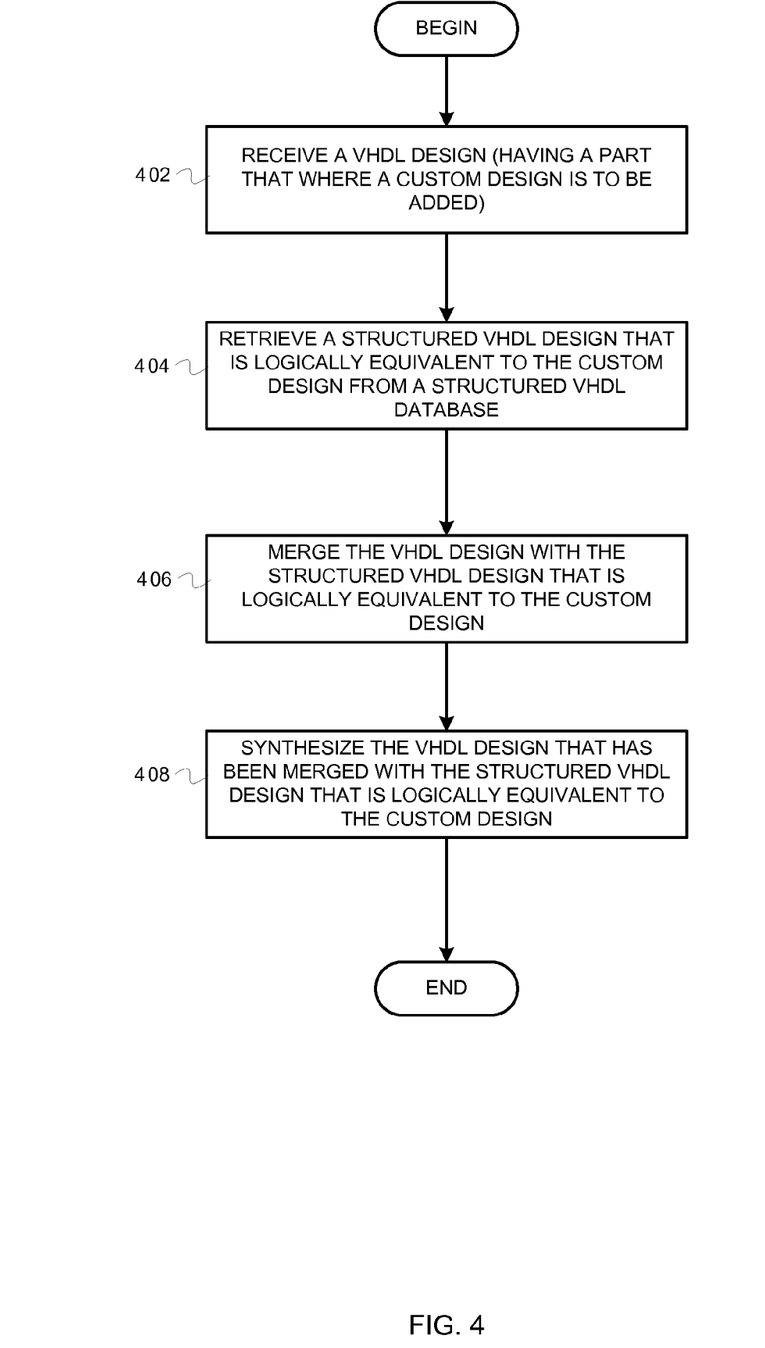
FIG. 4 is a flowchart for using reusable structured VHDL, according to some example embodiments.

Operations regarding structured VHDL are now described. In certain embodiments, the operations can be performed by executing instructions residing on machine-readable media (e.g., software), while in other embodiments, the operations can be performed by hardware and/or other logic (e.g., firmware). In some embodiments, the operations can be performed in series, while in other embodiments, one or more of the operations can be performed in parallel. Moreover, some embodiments can perform less than all the operations shown in any flowchart. Two flowcharts are now described. FIG. 3 illustrates operations for creating reusable structured VHDL. FIG. 4 illustrates operations for using reusable structured VHDL.

FIG. 3 is a flowchart for creating reusable structured VHDL, according to some example embodiments. With reference to FIG. 1, a flowchart 300 illustrates operations performed by the structured VHDL creation module 108.

The structured VHDL creation module 108 receives a VHDL design (having a part that includes a custom design) and receives an equivalent physical representation of the VHDL design (302). With reference to FIG. 2, this operation is described by the initial input into the dataflow diagram 200 (at 208 for the VHDL design and at 214 for the equivalent physical representation). As noted above, the custom design can comprise the timing critical paths that include timing critical structures within the VHDL design. Operations of the flowchart 300 continue.

The structured VHDL creation module 108 removes the custom design from within the VHDL design (304). With reference to FIG. 2, this operation is described by the processing at 208, wherein the output is the VHDL circuit design 202, wherein the part 212 is the location where the VHDL$_{custom}$ circuit design 204 has been removed. Operations of the flowchart 300 continue.

The structured VHDL creation module 108 compares the VHDL design to the equivalent physical representation (306). With reference to FIG. 2, this operation is described by the processing at 214, wherein the output is the delta list 216 of differences. This comparison identifies which part of the physical representation corresponds to the VHDL$_{custom}$ circuit design 204. Operations of the flowchart 300 continue.

The structured VHDL creation module 108 creates a physical representation for the custom design based on the comparison (308). With reference to FIG. 2, this operation is described by the processing at 218, wherein the output is the physical representation$_{custom}$ 220. Operations of the flowchart 300 continue.

The structured VHDL creation module 108 creates a structured VHDL design and associated placement data for the custom VHDL design using the physical representation for the custom design (310). With reference to FIG. 2, this operation is described by the processing at 222, wherein the output is the VHDL$_{custom,\ structured}$ circuit design 224 and the placement data 226. Operations of the flowchart 300 continue.

The structured VHDL creation module 108 modifies the structured VHDL design for the custom design to meet synthesis requirements, to protect from logic modification and to add wiring information (312). With reference to FIG. 2, this operation is described by the processing at 225, wherein the output is the modified VHDL$_{custom,\ structured}$ circuit design 228. Operations of the flowchart 300 continue.

The structured VHDL creation module 108 stores the structured VHDL design and the placement data for the custom design for subsequent reuse by hardware designers (314). With reference to FIG. 1, this operation is described by the reusable VHDL$_{custom,\ structured}$ circuit design 110 and placement data 112 being stored in the structured VHDL database 114. Operations of the flowchart 300 are complete.

FIG. 4 is a flowchart for using reusable structured VHDL, according to some example embodiments. With reference to FIG. 1, a flowchart 400 illustrates operations performed by the merge module 120 and the synthesis module 132.

The merge module 120 receives a VHDL design (having a part where a custom design is to be added) (402). With reference to FIG. 2, this operation is described by the input into the dataflow diagram 200 (at 234). For example, a hardware designer can create a hardware design using VHDL wherein a part remains empty. In particular in some example embodiments, if the structured VHDL design is to be reused, the port map for this VHDL design is included as an entity in the new top VHDL as part of a hierarchical VHDL design. This inclusion of the port map allows single parts of the VHDL design to be easily exchanged. The hardware designer or an analysis tool can determine that a reusable structured VHDL design that has been optimized (as described above) can be used in the current design. Operations of the flowchart 400 continue.

The merge module 120 retrieves a structured VHDL design that is logically equivalent to the custom design (404). With reference to FIG. 1, the merge module 120 can retrieve the structured VHDL design from the structured VHDL database 114. This retrieval can be at the request of the hardware designer that has located a particular structured VHDL design that they want to reuse in their current VHDL design. Embodiments can also retrieve the structured VHDL design with a software tool that examines the VHDL design and determines a suitable structured VHDL design. Operations of the flowchart 400 continue.

The merge module 120 merges the VHDL design (having a part where a custom design is to be added) with the structured VHDL design (406). With reference to FIG. 2, this operation is described by the operation at 234, wherein the modified VHDL$_{custom,\ structured}$ circuit design 228 has been merged into the new VHDL circuit design 230. Operations of the flowchart 400 continue.

The synthesis module 132 synthesizes the VHDL design that includes the structured VHDL design (that is logically equivalent to the custom design) (408). With reference to FIG. 2, this operation is described by the operation at 240, wherein a physical representation is created as a result of the synthesis operation. As described above, this physical representation includes the physical implementation details defined within the structured VHDL design. Accordingly, this physical representation has been optimized for the part that is logically equivalent to the circuit design (based on the physical implementation details defined within the structured VHDL design). The operations of the flowchart 400 are complete.

Figure 5:
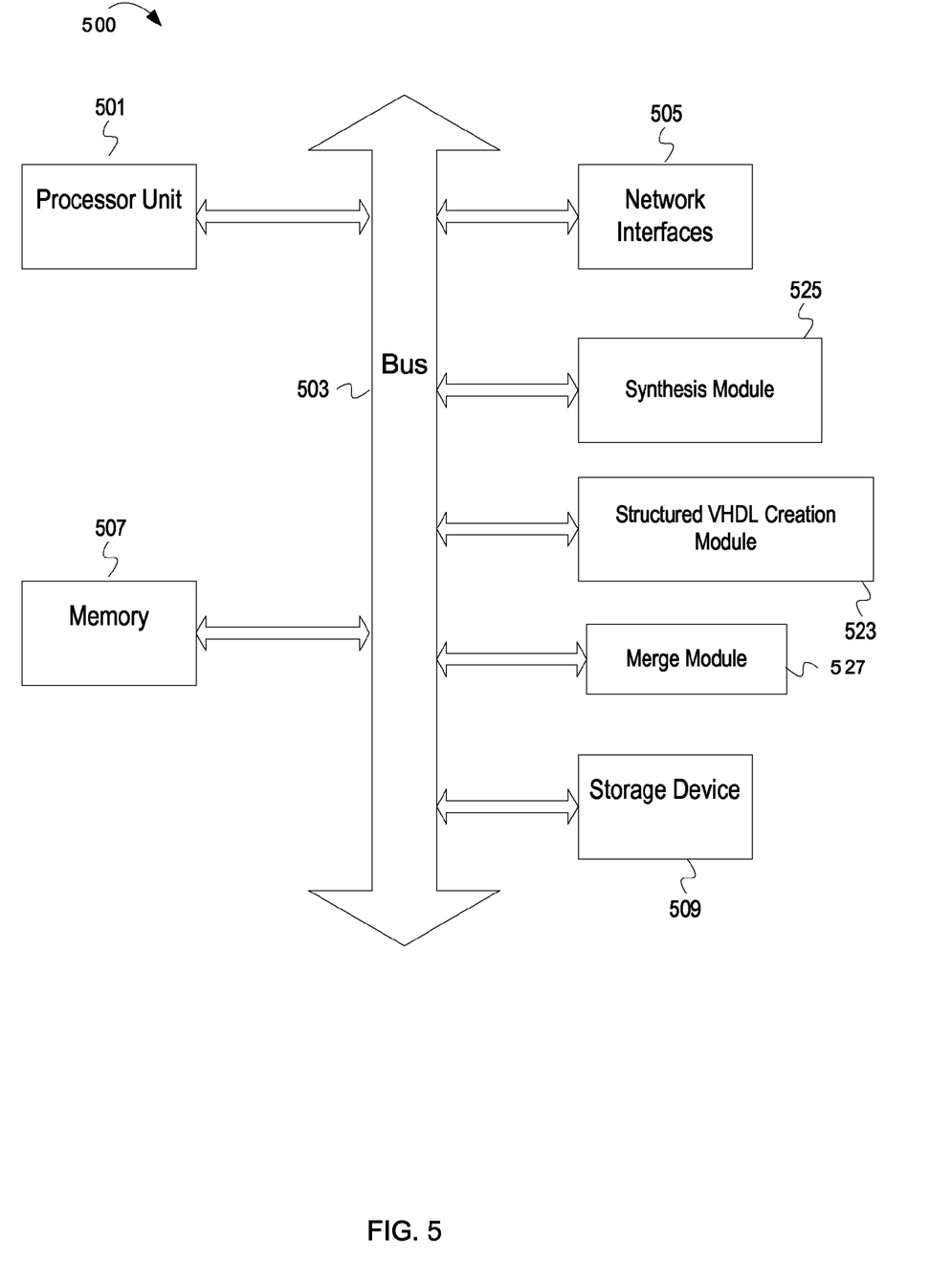
FIG. 5 is a block of a computer system, according to some example embodiments.

FIG. 5 is a block diagram illustrating a computer system, according to some example embodiments. A computer system 500 includes a processor unit 501 (possibly including multiple processors, multiple cores, multiple nodes, and/or implementing multi-threading, etc.). The computer system 500 includes memory 507. The memory 507 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system 500 also includes a bus 503 (e.g., PCI, ISA, PCI-Express, HyperTransport®, InfiniBand®, NuBus, etc.), a network interface 505 (e.g., an ATM interface, an Ethernet interface, a Frame Relay interface, SONET interface, wireless interface, etc.), and a storage device(s) 509 (e.g., optical storage, magnetic storage, etc.).

The computer system 500 also includes a synthesis module 525, a structured VHDL creation module 523, and a merge module 527. While shown as being on a same computer system 500, in some other example embodiments, the synthesis module 525, the structured VHDL creation module 523, and the merge module 527 can be on separate computer systems. The synthesis module 525, the structured VHDL creation module 523, and the merge module 527 performed various functionalities as described herein. Any one of these functionalities may be partially (or entirely) implemented in hardware and/or on the processing unit 501. For example, the functionality may be implemented with an application specific integrated circuit, in logic implemented in the processing unit 501, in a co-processor on a peripheral device or card, etc. Further, realizations may include fewer or additional components not illustrated in FIG. 5 (e.g., video cards, audio cards, additional network interfaces, peripheral devices, etc.). The processor unit 501, the storage device(s) 509, and the network interface 505 are coupled to the bus 503. Although illustrated as being coupled to the bus 503, the memory 507 may be coupled to the processor unit 501.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

While the embodiments are described with reference to various implementations and exploitations, it will be understood that these embodiments are illustrative and that the scope of the inventive subject matter is not limited to them. In general, techniques for generating and use of reusable structured hardware design language as described herein may be implemented with facilities consistent with any hardware system or hardware systems. Many variations, modifications, additions, and improvements are possible.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
    removing, based on execution of an instruction by a processor, a part of a logic from a hardware description language design to create a modified hardware language design, the part of the logic comprising at least one time sensitive path in the hardware description language design;
    comparing the modified hardware language design to a physical representation that is logically equivalent to the hardware description language design to create a delta list of differences;
    creating a modified physical representation that includes a part of the physical representation that includes the logical equivalent of the part of the logic comprising the at least one time sensitive path, using the delta list of differences;
    creating a structured hardware description language design of the part of the logic comprising the at least one time sensitive path using the modified physical representation, the structured hardware description language design comprising a physical implementation requirement of at least one component; and
    modifying the structured hardware description language design,
        wherein the modifying updates the structured hardware description language design to comply with requirements of a synthesis operation of a synthesis tool, and
        wherein the modifying precludes the synthesis tool from modifying the physical implementation requirement of the at least one component.

2. The method of claim 1, further comprising creating placement data that defines locations of components in the part of the logic comprising the at least one time sensitive path.

3. The method of claim 2, further comprising:
    merging a new hardware description language design with the structured hardware description language design of the part of the logic comprising at least one time sensitive path to create a merged hardware description language design; and
    synthesizing the merged hardware description language design, using the placement data, to create a physical representation of the merged hardware description language design.

4. The method of claim 1, wherein the physical implementation requirement comprises at least one of a placement of a component and a requirement of a wire coupling components together.

5. The method of claim 4, wherein a requirement of the wire comprises a layer where the wire is located and a width of the wire.

6. A computer program product for creating a structured hardware description language design, the computer program product comprising:
    a non-transitory computer readable storage medium having computer readable program code embodied therewith, the computer readable program code configured to,
        remove, based on execution of an instruction by a processor, a part of a logic from a hardware description language design to create a modified hardware language design, the part of the logic comprising at least one time sensitive path in the hardware description language design;
        compare the modified hardware language design to a physical representation that is logically equivalent to the hardware description language design to create a delta list of differences;
        create a modified physical representation that includes a part of the physical representation that includes the logical equivalent of the part of the logic comprising the at least one time sensitive path, using the delta list of differences;
        create a structured hardware description language design of the part of the logic comprising the at least one time sensitive path using the modified physical representation, the structured hardware description language design comprising a physical implementation requirement of at least one component; and
        modify the structured hardware description language design,
            wherein the computer readable program code to modify comprises computer readable program code configured to update the structured hardware description language design to comply with requirements of a synthesis operation of a synthesis tool, and
            wherein the computer readable program code to modify comprises computer readable program code configured to preclude the synthesis tool from modifying the physical implementation requirement of the at least one component.

7. The computer program product of claim 6, wherein the computer program code is configured to create placement data that defines locations of components in the part of the logic comprising the at least one time sensitive path.

8. The computer program product of claim 7, wherein the computer program code is configured to,
    merge a new hardware description language design with the structured hardware description language design of the part of the logic comprising at least one time sensitive path to create a merged hardware description language design; and
    synthesize the merged hardware description language design, using the placement data, to create a physical representation of the merged hardware description language design.

9. The computer program product of claim 6, wherein the physical implementation requirement comprises at least one of a placement of a component and a requirement of a wire coupling components together.

10. The computer program product of claim 9, wherein a requirement of the wire comprises a layer where the wire is located and a width of the wire.

11. An apparatus comprising:

a processor; and a structured hardware description language design module executable on the processor, the structured hardware description language design module configured to, remove, based on execution of an instruction by a processor, a part of a logic from a hardware description language design to create a modified hardware language design, the part of the logic comprising at least one time sensitive path in the hardware description language design;

compare the modified hardware language design to a physical representation that is logically equivalent to the hardware description language design to create a delta list of differences;

create a modified physical representation that includes a part of the physical representation that includes the logical equivalent of the part of the logic comprising the at least one time sensitive path, using the delta list of differences;

create a structured hardware description language design of the part of the logic comprising the at least one time sensitive path using the modified physical representation, the structured hardware description language design comprising a physical implementation requirement of at least one component; and modify the structured hardware description language design, wherein the computer readable program code to modify comprises computer readable program code configured to update the structured hardware description language design to comply with requirements of a synthesis operation of a synthesis tool, and wherein the computer readable program code to modify comprises computer readable program code configured to preclude the synthesis tool from modifying the physical implementation requirement of the at least one component.

12. The apparatus of claim 11, wherein the structured hardware description language design module is configured to create placement data that defines locations of components in the part of the logic comprising the at least one time sensitive path.

13. The apparatus of claim 12, wherein the structured hardware description language design module is configured to, merge a new hardware description language design with the structured hardware description language design of the part of the logic comprising at least one time sensitive path to create a merged hardware description language design; and synthesize the merged hardware description language design, using the placement data, to create a physical representation of the merged hardware description language design.

14. The apparatus of claim 11, wherein the physical implementation requirement comprises at least one of a placement of a component and a requirement of a wire coupling components together.

15. The apparatus of claim 14, wherein a requirement of the wire comprises a layer where the wire is located and a width of the wire.

* * * * *